US012757517B2

(12) United States Patent
Meng et al.

(10) Patent No.: US 12,757,517 B2
(45) Date of Patent: Oct. 6, 2026

(54) SOLAR CELL AND PREPARATION METHOD THEREFOR AND APPLICATION THEREOF

(71) Applicant: TONGWEI SOLAR (CHENGDU) CO., LTD., Chengdu (CN)

(72) Inventors: Xiajie Meng, Meishan (CN); Guoqiang Xing, Meishan (CN)

(73) Assignee: TONGWEI SOLAR (CHENGDU) CO., LTD., Chengdu (CN)

(*) Notice: Subject to any disclaimer, the term of this patent is extended or adjusted under 35 U.S.C. 154(b) by 0 days.

(21) Appl. No.: 18/834,069

(22) PCT Filed: Dec. 30, 2022

(86) PCT No.: PCT/CN2022/143685
§ 371 (c)(1),
(2) Date: Jul. 29, 2024

(87) PCT Pub. No.: WO2023/216628
PCT Pub. Date: Nov. 16, 2023

(65) Prior Publication Data

US 2025/0126923 A1 Apr. 17, 2025

(30) Foreign Application Priority Data

May 7, 2022 (CN) ......................... 202210489495.3

(51) Int. Cl.
*H10F 71/00* (2025.01)
*H10F 10/14* (2025.01)

(52) U.S. Cl.
CPC ........... *H10F 71/129* (2025.01); *H10F 10/14* (2025.01)

(58) Field of Classification Search
None
See application file for complete search history.

(56) References Cited

U.S. PATENT DOCUMENTS

2012/0040487 A1 2/2012 Asthana et al.
2016/0284896 A1* 9/2016 Westerberg ........... H10F 10/146
2016/0284923 A1* 9/2016 Johnson ................ H10F 10/146

FOREIGN PATENT DOCUMENTS

CN 105762234 B 12/2017
CN 108521832 A 9/2018
(Continued)

OTHER PUBLICATIONS

Examination Report received in corresponding Application Number AU 2022457985, dated Jul. 29, 2025, 8 pages.
(Continued)

*Primary Examiner* — Dustin Q Dam
(74) *Attorney, Agent, or Firm* — Dority & Manning, PA

(57) ABSTRACT

A preparation method for a solar cell includes: providing a silicon wafer substrate having a first surface and a second surface, which is opposite to the first surface; forming a silicon-containing thin film comprising a doped layer on the first surface of the silicon wafer substrate, wherein the forming method for the doped layer comprises: forming a partially doped layer in an atmosphere in which the flow rate of a dopant gas source is 100-1000 sccm and the flow rate of silane is 1000-4000 sccm, and forming a remaining doped layer in an atmosphere in which the flow rate of the dopant gas source is 1500-3000 sccm and the flow rate of the silane remains unchanged; forming a patterned region; and performing a texturing treatment.

20 Claims, 3 Drawing Sheets

10

(56) References Cited

FOREIGN PATENT DOCUMENTS

| | | | | | |
|---|---|---|---|---|---|
| CN | 112885925 | A | * | 6/2021 | ........... H10F 71/121 |
| CN | 113675295 | A | | 11/2021 | |
| CN | 113690328 | A | * | 11/2021 | ........... H10F 71/121 |
| CN | 214797433 | U | | 11/2021 | |
| CN | 113782639 | A | | 12/2021 | |
| CN | 114256385 | A | | 3/2022 | |
| CN | 216054727 | U | | 3/2022 | |
| CN | 114361295 | A | | 4/2022 | |
| WO | WO 2009117083 | A2 | | 9/2009 | |
| WO | WO 2017113299 | A1 | | 7/2017 | |

OTHER PUBLICATIONS

Notice of Allowance (with English translation) received in corresponding Application Number CN 202210489495.3. dated Mar. 5, 2024, 10 pages.

Extended European Search Report received in corresponding Application No. EP 22941560.9, dated Sep. 2, 2025, 9 pages.

* cited by examiner

10

SOLAR CELL AND PREPARATION METHOD THEREFOR AND APPLICATION THEREOF

CROSS-REFERENCE TO RELATED APPLICATIONS

This application is a U.S. national phase application under 35 U.S.C. § 371 based upon international patent application No. PCT/CN2022/143685, filed on Dec. 30, 2022, which itself claims the priority of Chinese Patent Application No. 2022104894953, filed on May 7, 2022, entitled "SOLAR CELL AND PREPARATION METHOD THEREFOR AND APPLICATION THEREOF". The contents of the above identified applications are hereby incorporated herein in their entireties by reference.

TECHNICAL FIELD

The present disclosure relates to the field of cells, in particular to a solar cell and a preparation method therefor and an application thereof.

BACKGROUND

Due to the design of a front surface of a back contact solar cell without a grid line electrode, the front surface of the back contact solar cell has no shielding to light, and the incident light can be used to the greatest extent. In combination with a trapping light structure composed of a pyramid suede structure and an anti-reflection film adopted by a front side of the cell, an optical loss of the cell is reduced, and a short-circuit current density of the cell is effectively improved. Interdigitated back contact solar cell (IBC) can further optimize a trapping and passivation performance of the front surface without considering a contact resistance on the front side due to a particularity (metal electrodes are located on a back side of the cell, and positive and negative electrodes are arranged in an interdigitated manner) of structure of components thereof. A back portion can optimize the metal grid electrode, thus reducing a series resistance and increasing a filling factor.

A conventional back contact solar cell structure has a tunneling oxygen passivation contact (TOPCon) structure, and a passivation structure includes an ultrathin silicon oxide layer and a heavily doped polysilicon layer to passivate a back surface of the cell. A passivation mechanism of the structure is as follows: the ultrathin silicon oxide is directly in contact with a silicon wafer substrate to neutralize dangling bonds on a surface of the silicon and perform excellent chemical passivation. Due to a difference of Fermi energy level between a heavily doped polysilicon layer and a silicon wafer substrate, so that energy band bending is caused on the surface of the silicon wafer substrate, which can more effectively block the passage of minority carriers without affecting the transmission of majority carriers, thereby achieving selective collection of carriers. The carriers can be directly and efficiently transmitted in one-dimensional longitudinal direction through an oxide layer, so that a current transmission path is the shortest, the recombination caused by the carriers in the two-dimensional transmission process is avoided, the series resistance of the cell is reduced, the cell has a higher filling factor, and thus higher photoelectric conversion efficiency can be obtained. However, in the conventional preparation of the above-mentioned TOPCon structure, a doping layer is prepared by low pressure chemical vapor deposition (LPCVD) and plasma enhanced chemical vapor deposition (PECVD), and since the doping layer is relatively thick, a certain thickness of doping layer material will be coated around the front side of the cell using the above deposition method. A formed wrap plating material will greatly reduce the conversion efficiency of the cell, resulting in a certain degree of leakage. In addition, phosphorus diffusion in a LPCVD route also affects the front side of the cell, so that a wet process is usually added to remove these wrap plating. However, adding the wet process will not only increase equipment and labor costs, but may also affect an appearance of the front side of the cell itself due to the wet process, which will also affect the cell conversion efficiency.

SUMMARY

The present disclosure provides a preparation method for a solar cell, including the following steps:

- S10, providing a silicon wafer substrate, wherein the silicon wafer substrate has a first surface and a second surface opposite to the first surface;
- S20, forming a silicon-containing film on the first surface of the silicon wafer substrate, the silicon-containing film including a silicon oxide layer, a doping layer, and a mask layer that are sequentially formed on the first surface of the silicon wafer substrate, wherein a method for forming the doping layer having a thickness of 30 nm to 300 nm includes: forming a doping layer having a thickness of 10 nm to 30 nm in an atmosphere in which a flow rate of a doping gas source is 100 sccm to 1000 sccm and a flow rate of silane is 1000 sccm to 4000 sccm, and forming a remaining thickness of the doping layer in an atmosphere in which a flow rate of the doping gas source is 1500 sccm to 3000 sccm and a flow rate of the silane is 1000 sccm to 4000 sccm;
- S30, patterning the silicon-containing film on the first surface to form a patterned region; and
- S40, performing texturing treatment to the silicon wafer having the silicon-containing film and the patterned region.

In some embodiments of the present disclosure, a temperature for forming the doping layer in step S20 is 200° C. to 700° C.

In some embodiments of the present disclosure, the doping gas source is selected from at least one of phosphorane, diborane, trimethylborane, and boron trifluoride.

In some embodiments of the present disclosure, the preparation method for the solar cell further includes a step of annealing after step S20 and prior to step S30.

In some embodiments of the present disclosure, in the step of annealing, an annealing temperature is 800° C. to 950° C., and an annealing time is 30 min to 50 min.

In some embodiments of the present disclosure, the silicon oxide layer is formed on the first surface by plasma enhanced chemical vapor deposition, low pressure chemical vapor deposition, or thermal oxygen.

In some embodiments of the present disclosure, a thickness of the silicon oxide layer 0.5 nm to 2.5 nm.

In some embodiments of the present disclosure, the mask layer is formed on the doping layer by thermal oxygen, plasma enhanced chemical vapor deposition, or low pressure chemical vapor deposition.

In some embodiments of the present disclosure, a thickness of the mask layer is 5 nm to 100 nm.

In some embodiments of the present disclosure, the preparation method for the solar cell further includes: after preparing the silicon wafer substrate with a textured surface, forming a first passivation film layer and a first anti-reflection film layer sequentially on the first surface of the silicon wafer substrate with the textured surface.

In some embodiments of the present disclosure, the preparation method for the solar cell further includes: after preparing the silicon wafer substrate with a textured surface, forming a second passivation film layer and a second anti-reflection film layer sequentially on the second surface of the silicon wafer substrate with the textured surface.

In some embodiments of the present disclosure, the preparation method for the solar cell further includes, after step S50, a step S60, forming a hole on the patterned region on the first surface by patterning using a laser, and preparing a first electrode and a second electrode by screen printing.

According to still some embodiments of the present disclosure, a solar cell is further provided, which is prepared by a preparation method including the following steps:

- S10, providing a silicon wafer substrate, wherein the silicon wafer substrate has a first surface and a second surface opposite to the first surface;
- S20, forming a silicon-containing film on the first surface of the silicon wafer substrate, the silicon-containing film including a silicon oxide layer, a doping layer, and a mask layer that are sequentially formed on the first surface of the silicon wafer substrate, wherein a method for forming the doping layer having a thickness of 30 nm to 300 nm includes forming a doping layer having a thickness of 10 nm to 30 nm in an atmosphere in which a flow rate of a doping gas source is 100 sccm to 1000 sccm and a flow rate of silane is 1000 sccm to 4000 sccm, and forming a remaining thickness of the doping layer in an atmosphere in which a flow rate of the doping gas source is 1500 sccm to 3000 sccm and a flow rate of the silane is 1000 sccm to 4000 sccm;
- S30, patterning the silicon-containing film on the first surface to form a patterned region; and
- S40, performing texturing treatment to the silicon wafer substrate having the silicon-containing film and the patterned region.

In some embodiments of the present disclosure, a temperature for forming the doping layer in step S20 is 200° C. to 700° C.

In some embodiments of the present disclosure, the doping gas source is selected from at least one of phosphorane, diborane, trimethylborane, and boron trifluoride.

In some embodiments of the present disclosure, the preparation method further includes a step of annealing after step S20 and prior to step S30.

In some embodiments of the present disclosure, in the step of annealing, an annealing temperature is 800° C. to 950° C., and an annealing time is 30 min to 50 min.

In some embodiments of the present disclosure, the silicon oxide layer is formed on the first surface by plasma enhanced chemical vapor deposition, low pressure chemical vapor deposition, or thermal oxygen.

In some embodiments of the present disclosure, a thickness of the silicon oxide layer 0.5 nm to 2.5 nm.

In some embodiments of the present disclosure, the mask layer is formed on the doping layer by thermal oxygen, plasma enhanced chemical vapor deposition, or low pressure chemical vapor deposition.

In some embodiments of the present disclosure, a thickness of the mask layer is 5 nm to 100 nm.

In some embodiments of the present disclosure, the preparation method further includes: after preparing the silicon wafer substrate with a textured surface, forming a first passivation film layer and a first anti-reflection film layer sequentially on the first surface of the silicon wafer substrate with the textured surface.

In some embodiments of the present disclosure, the preparation method further includes: after preparing the silicon wafer substrate with a textured surface, forming a second passivation film layer and a second anti-reflection film layer sequentially on the second surface of the silicon wafer substrate with the textured surface.

In some embodiments of the present disclosure, the preparation method further includes, after step S50, a step S60, forming a hole on the patterned region on the first surface by patterning using a laser, and preparing a first electrode and a second electrode by screen printing.

According to still some embodiments of the present disclosure, a photovoltaic system is further provided, which includes a solar cell assembly and an auxiliary device, the solar cell assembly including the solar cell as described in any of the aforementioned embodiments.

Details of one or more embodiments of the present disclosure are set forth in the following drawings and descriptions. Other features, objects and advantages of the present disclosure will become apparent with reference to the specification, drawings, and claims.

BRIEF DESCRIPTION OF THE DRAWINGS

To better describe and illustrate embodiments and/or examples of the present disclosure, reference may be made to one or more of the accompanying drawings. The additional details or examples used to describe the drawings should not be construed as limiting the scope of any of the disclosed disclosures, the embodiments and/or examples presently described, and the best modes currently understood of these disclosures.

Figure 1:
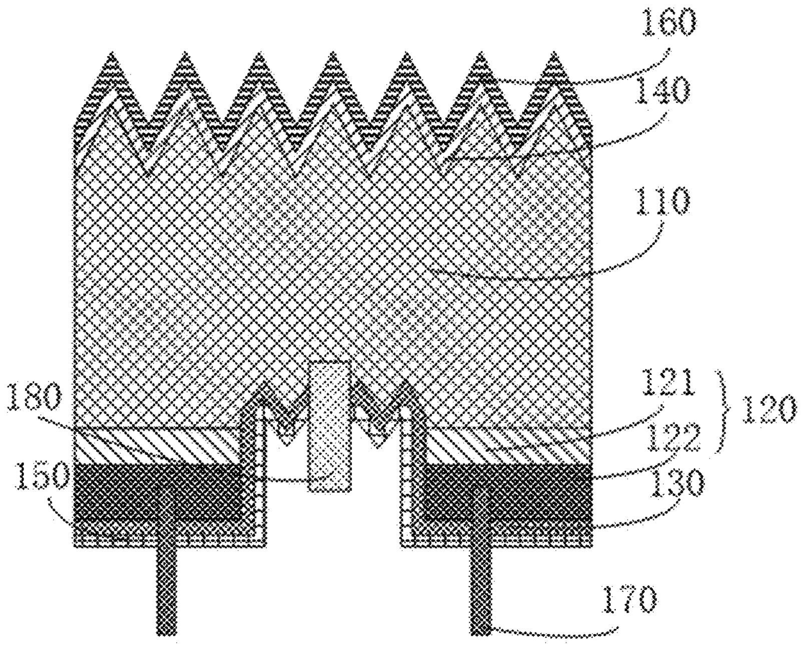
FIG. 1 is a structure of a solar cell according to the present disclosure.

Description of drawings: 10: Solar cell, 110: Substrate, 111: Patterned region, 120: Composite film layer, 121 Silicon oxide layer, 122: doping layer, 123: Silicon-containing film, 130: First passivation film layer, 140: Second passivation film layer, 150: First anti-reflection film layer, 160: Second anti-reflection film layer, 170: First electrode, 180: Second electrode.

DETAILED DESCRIPTION OF THE EMBODIMENTS

The present disclosure may be implemented in many different forms and is not limited to the embodiments described herein. On the contrary, the purpose of providing these embodiments is to make the public content of the present disclosure more thoroughly and comprehensively understood. Certainly, they are merely examples and are not intended to limit the present disclosure. In addition, reference numerals and/or letters may be repeated in different embodiments of the present disclosure. This repetition is for purposes of simplicity and clarity and does not in itself indicate a relationship between the various embodiments and/or arrangements discussed.

In addition, the terms "first" and "second" are used for descriptive purposes only and cannot be understood as indicating or implying relative importance or implicitly indicating the number or order of indicated technical features. Therefore, features defined as "first" and "second" may explicitly or implicitly include at least one of these features. In the description of the present disclosure, "plurality" means at least two, such as two, three, etc., unless otherwise expressly and specifically limited. In the description of the present disclosure, "several" means at least one, for example, one, two, etc., unless otherwise expressly and specifically limited.

The terms "preferably," "more preferably" and the like in the present disclosure refer to embodiments of the present disclosure that may provide certain beneficial effects in some cases. However, other embodiments may also be preferred in the same case or in other cases. Furthermore, the representation of one or more preferred embodiments does not imply that other embodiments are not available, nor is it intended to exclude other embodiments from the scope of the present disclosure.

When a numerical range is disclosed herein, the range is considered continuous and includes the minimum and maximum values of the range and every value between such minimum and maximum values. Further, when the range refers to integers, every integer between the minimum value and the maximum value of the range is included. Further, when multiple ranges are provided to describe a feature or characteristics, the ranges may be combined. In other words, unless otherwise indicated, all ranges disclosed herein shall be understood to include any and all subranges subsumed therein.

Unless otherwise defined, all technical and scientific terms used herein have the same meaning as commonly understood by one of ordinary skill in the art to which this application belongs. The terms used herein in the description of the present disclosure are for the purpose of describing specific embodiments only, and are not intended to limit the present disclosure. As used herein, the term "and/or" includes any and all combinations of one or more of the associated listed items.

The present disclosure provides a preparation method for a solar cell 10 as shown in FIG. 1, which includes the following steps.

Step S10, A silicon wafer substrate 110 is provided, and the silicon wafer substrate 110 has a first surface and a second surface opposite to the first surface.

Further, the first surface is a backlight surface of the cell, which is also called a back surface, and the second surface is a light-receiving surface of the cell, which is also called a front surface.

It should be understood that prior to step S10, the silicon wafer substrate 110 is further subjected to de-damage treatment, polishing treatment, and cleaning treatment.

Further, the de-damage treatment includes a treatment with a monobasic strong base containing a substance at a concentration of 0.6 mol/L to 0.8 mol/L at 50° C. to 70° C.

Specifically, a temperature of the de-damage treatment may be, but is not limited to, 50° C., 55° C., 60° C., 65° C., or 70° C.

Preferably, a solution for the de-damage treatment is a mixed solution of 46% by mass of sodium hydroxide solution and water at a volume ratio of 4:96 to 6:94.

Further, the polishing treatment includes a treatment with a monobasic strong base solution containing a substance at a concentration of 0.6 mol/L to 0.8 mol/L at 65° C. to 85° C., so that a reflectivity after polishing is 20% to 40%. Specifically, the reflectivity after polishing may be, but is not limited to, 20%, 25%, 30%, 35% or 40%, Preferably, the reflectivity of the silicon wafer substrate after polishing is 30%.

In a specific example, the cleaning treatment includes cleaning with a mixed solution of hydrofluoric acid and hydrochloric acid, and deionized water in sequence, and drying.

Step S20, A silicon-containing film 123 is formed on the first surface of the silicon wafer substrate 110. The silicon-containing film includes a silicon oxide layer 121, a doping layer 122, and a mask layer that are sequentially formed on the first surface of the silicon wafer substrate 110.

The silicon oxide layer 121 having a thickness of 0.5 nm to 2.5 nm is formed on the silicon wafer substrate by plasma enhanced chemical vapor deposition, low pressure chemical vapor deposition, or thermal oxygen.

It should be understood that the thickness of the silicon oxide layer 121 may be, but is not limited to, 0.5 nm, 1 nm, 2 nm, or 2.5 nm.

Specifically, the silicon oxide layer 121 is preferably formed by plasma enhanced chemical vapor deposition.

In a specific example, the step of forming the silicon oxide layer 121 in the step S10 includes: introducing silane gas at a flow rate of 1000 sccm to 5000 sccm and introducing hydrogen gas at a flow rate of 6000 sccm to 15000 sccm. In the above gas atmosphere, glow discharge is performed at a temperature of 350° C. to 600° C., a power supply of 9 KW to 12 KW, and a plasma pulse on-off ratio of 1:100 ms to form a silicon oxide layer 121 on the formed substrate.

Preferably, the flow rate of the silane gas is 2500 sccm to 3000 sccm and the flow rate of the hydrogen gas is 8000 sccm to 10000 sccm.

Further, the temperature for preparing the silicon oxide layer 121 is prepared is preferably 400° C. to 450° C. Specifically, the temperature for preparing the silicon oxide layer 121 may be, but is not limited to, 410° C., 420° C., 430° C., 440° C. or 450° C.

Further, the power supply power is 9 KW to 10 KW.

The doping layer 122 with a thickness of 30 nm to 300 nm is formed on the silicon oxide layer by a physical vapor deposition in an atmosphere containing a doping gas source and silane.

In which a doping layer having a thickness of 10 nm to 30 nm is formed in an atmosphere containing a doping gas source at a flow rate of 100 sccm to 1000 sccm and silane at a flow rate of 1000 sccm to 4000 sccm, and the remaining doping layer 122 is formed in an atmosphere containing a doping gas source at a flow rate of 1500 sccm to 3000 sccm and silane at a flow rate of 1000 sccm to 4000 sccm.

Further, the doping layer 122 having a thickness of 10 nm to 30 nm is formed in an atmosphere containing a doping gas source at a flow rate of 200 sccm to 800 sccm and silane at a flow rate of 2000 sccm to 3600 sccm.

Preferably, in the above method for forming the doping layer 122 having the thickness of 10 nm to 30 nm, the flow rate of the doping gas source may be, but is not limited to, 200 sccm, 300 sccm, 400 sccm, 500 sccm, 600 sccm, 700 sccm, or 800 sccm, and the flow rate of the silane may be, but is not limited to, 3600 sccm, 2200 sccm, 2400 sccm, 2600 sccm, 2700 sccm, 2800 sccm, 2900 sccm, 3000 sccm, 3200 sccm, 3400 sccm, or 3600 sccm.

Further, the remaining doping layer 122 is formed in an atmosphere containing a doping gas source at a flow rate of 2000 sccm to 3000 sccm and silane at a flow rate of 2000 sccm to 3600 sccm.

Preferably, in the above method for the remaining thickness of the doping layer 122, the flow rate of the doping gas source may be, but is not limited to, 2000 sccm, 2200 sccm, 2400 sccm, 2600 sccm, 2800 sccm, or 3000 sccm, and the flow rate of the silane may be, but is not limited to, 2000 sccm, 2200 sccm, 2400 sccm, 2600 sccm, 2700 sccm, 2800 sccm, 2900 sccm, 3000 sccm, 3200 sccm, 3400 sccm, or 3600 sccm.

Further, a pressure in a tube during the preparation process of forming the doping layer 122 is 1 Pa to 150 Pa. Furthermore, a time for preparing the doping layer 122 is 5 min to 20 min.

In a specific example, a temperature for forming the doping layer 122 is 200° C. to 700° C., preferably 300° C. to 600° C., and more preferably 400° C. to 500° C.

Further, the temperature for forming the doping layer 122 may be, but is not limited to, 300° C., 350° C., 400° C., 450° C., 500° C., 550° C., or 600° C.

In a specific example, the doping gas source is selected from at least one of phosphorane, diborane, trimethylborane, and boron trifluoride.

It should be understood that, in order to prepare the p-type doping layer 122, the doping gas source may be phosphorane, and in order to prepare the n-type doping layer 122, the doping gas source may be selected from at least one of diborane, trimethylborane, and boron trifluoride.

A doping concentration of the doping layer 122 can be achieved by combining the flow rate of the doping gas source, the flow rate of the silane and a deposition temperature during the physical vapor deposition.

Preferably, the thickness of the doping layer 122 is 100 nm to 150 nm. It should be understood that the thickness of the doping layer 122 may be, but is not limited to, 100 nm, 110 nm, 120 nm, 130 nm, 140 nm, or 150 nm.

In a specific example, the mask layer having a thickness of 5 nm to 100 nm is formed on the doping layer 122 by thermal oxygen, plasma enhanced chemical vapor deposition, or low pressure chemical vapor deposition.

In a specific example, the thickness of the mask layer is 5 nm to 100 nm.

It should be understood that the mask layer may be made of, but is not limited to, silicon oxide and silicon nitride.

Preferably, the mask layer is made of silicon oxide, and the silicon oxide layer is grown in-situ on a surface of the doping layer 122 as the mask layer by introducing oxygen at a high temperature using a thermal oxygen growth method, the temperature is 600° C. to 950° C., a time is 15 min to 45 min, and a flow rate of the oxygen is 8000 sccm to 13000 sccm.

After the silicon-containing film 123 is formed, annealing treatment is performed. It should be understood that objects of the annealing treatment includes the formed silicon oxide layer 121 and the doping layer 122, and the mask layer may also be annealed.

In a specific example, an annealing temperature in step S30 is 800° C. to 950° C., and an annealing time is 30 min to 50 min.

Further, the annealing treatment can not only convert the amorphous silicon deposited by physical vapor deposition into polycrystalline silicon, so that crystal grains grow and become larger, but also can make the mask layer more dense, and greatly improve the alkali resistance.

In the above preparation method for the solar cell 10, the doping layer 122 is prepared by controlling the flow rate of the doping source gas using the physical vapor deposition, which not only achieves the preparation of the doping layer 122, but also the wrap-around plating phenomenon occurring on the front surface of the substrate can be further effectively reduced. After the silicon-containing film 123 is prepared and the patterned region is formed by a laser processing, no additional process is required to remove the redundant material of the doping layer 122 generated by the wrap plating, thereby effectively reducing the process of preparing the cell, such as a wet process, without affecting a cell conversion efficiency of and the appearance of the front surface of the cell.

Step S30, the silicon-containing film 123 on the first surface is patterned by a laser to form a patterned region 111 on the first surface of the silicon wafer substrate 110.

Figure 2:
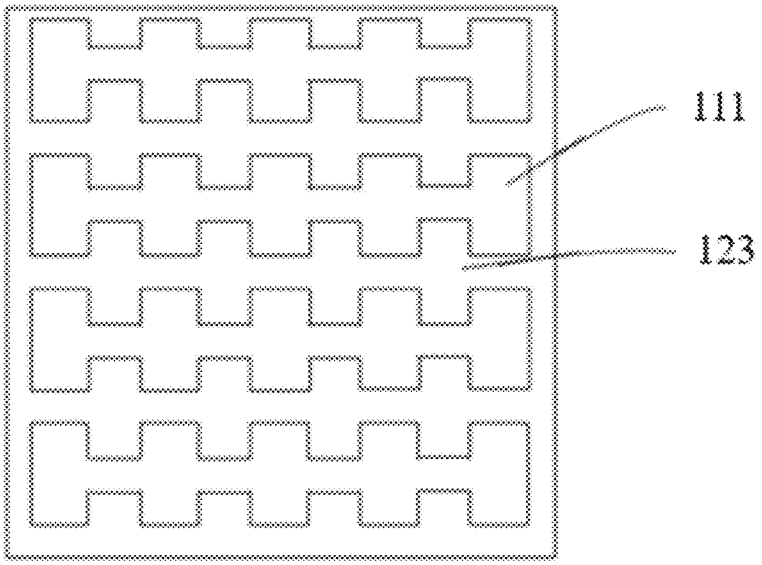
FIG. 2 is a bottom view of a patterned region after a silicon-containing film is patterned.

Specifically, a picosecond laser is used to remove the silicon-containing film 123 in a partial region on the first surface of the silicon wafer substrate 110 using a nano-laser of ultraviolet light 355 nm or 532 nm to form the patterned region 111 having a width of 300 μm to 500 μm, and a part of the silicon-containing film in the patterned region 111 is removed or destroyed to make it more susceptible to corrosion by alkaline solutions. FIG. 2 is a bottom view of the patterned region 111 after the silicon-containing film 123 is patterned.

Step S40, the silicon wafer substrate 110 having the silicon-containing film 123 and the patterned region 111 is subjected to texturing treatment.

A step of treating the mask layer material coated on the second surface of the substrate 110 with a hydrofluoric acid solution having a concentration of 4 mol/L to 6 mol/L prior to texturing is also included.

The first surface of the substrate 110 is placed horizontally away from the hydrofluoric acid solution, and the first surface of the substrate 110 is covered with deionized water to avoid damaging the silicon oxide mask layer on the first surface due to contact with the hydrofluoric acid solution. The second surface of the substrate 110 is in contact with the hydrofluoric acid solution to remove the silicon oxide mask layer generated by the wrap plating, and the cleaning time is 60 s to 240 s.

It should be understood that the hydrofluoric acid solution is prepared by mixing hydrofluoric acid with a mass fraction of 49% and water in a volume ratio of (10 to 30):(70 to 90). Preferably, the hydrofluoric acid with a mass fraction of 49% and water in a ratio of 20:80 is mixed to prepare the hydrofluoric acid solution.

In a specific example, a pretreated silicon wafer substrate 110 is subjected to a texturing treatment in which the silicon wafer substrate 110 having the silicon-containing film 123 and the patterned region 111 is placed in a texturing solution containing a monobasic strong base at a concentration of 0.15 mol/L to 0.35 mol/L for texturing for 400 s to 600 s to prepare the silicon wafer substrate 110 having a textured surface.

In a particular example, the monobasic strong base is selected from at least one of potassium hydroxide and sodium hydroxide.

It should be understood that the purpose of making a pile is to form a pyramid-shaped textured surface on the second surface of the substrate 110, i.e., the light-receiving surface.

Further, the texturing solution may further include an additive, and the additive may be, but is not limited to, indolylpropionic acid (IPA). The additive usually does not directly participate in the chemical reaction, but has the functions of reducing the surface tension of the solution, improving the uniformity of the reaction, regulating the corrosion rate of the monobasic strong base, significantly reducing the reaction rate, and enhancing the anisotropy of the corrosion.

After the texturing, the silicon wafer substrate 110 with the textured surface may be subjected to, but is not limited to, water washing, alkaline washing, water washing, acid washing, water washing and drying.

The alkaline washing is carried out using a sodium hydroxide aqueous solution with a substance amount of 0.1% to 0.2%. Further, the acid washing removes the outermost silicon oxide mask layer on the non-patterned region beyond the patterned region 111 on the first surface of the substrate 110 using an acid solution containing hydrofluoric acid.

In a specific example, after the silicon wafer substrate 110 with the textured surface is prepared, the method further includes the following step S50: a first passivation film layer 130 and a first anti-reflection film layer 150 are sequentially formed on the first surface of the silicon wafer substrate 110 with the textured surface and the composite film layer 120.

It should be understood that the first passivation film layer 130 and the first anti-reflection film layer 150 are sequentially formed on the first surface of the silicon wafer substrate 110 with the textured surface, the silicon oxide layer 121, and the doping layer 122.

Further, a second passivation film and a second anti-reflection film layer 160 are sequentially formed on the second surface of the silicon wafer substrate 110 with the textured surface.

It should be understood that the first passivation film layer 130 and the second passivation film layer 140 may be formed by, but are not limited to, an atomic layer deposition method. Further, the first passivation film layer 130 and the second passivation film layer 140 may be made of, but are not limited to, aluminum oxide.

In a specific example, a thickness of the first passivation film layer 130 is 2 nm to 25 nm. A thickness of the second passivation film layer 140 is 2 nm to 25 nm.

Further, the first anti-reflection film layer 150 and the second anti-reflection film layer 160 may be formed by, but is not limited to, plasma enhanced chemical vapor deposition. Further, the first anti-reflection film layer 150 and the second anti-reflection film layer 160 may be made of, but is not limited to, at least one of silicon oxide, silicon oxynitride, and silicon nitride.

Further, a thickness of the first anti-reflection film layer 150 is 50 nm to 150 nm. A thickness of the second anti-reflection film layer 160 is 60 nm to 150 nm.

It should be understood that the material of the first anti-reflection film layer 150 and the material of the second anti-reflection film layer 160 contain silicon oxide, silicon oxynitride, and silicon nitride materials, which are stacked in three layers.

In a specific example, the method further includes a step S60: the patterned region on the first surface is patterned by a laser to form a hole, and a first electrode 170 and a second electrode 180 are prepared by screen printing.

A burn-through electrode slurry is coated on the first surface except the patterned region 111, the first passivation film layer 130 and the first anti-reflection film layer 150 where the burn-through electrode slurry is coated is removed, and the burn-through electrode slurry is injected until the burn-through electrode slurry is in contact with the silicon-containing film 123 to form the first electrode 170;

The patterned region 111 on the first surface is patterned by a laser to form a hole, the first passivation film layer 130 and the first anti-reflection film layer 150 at the hole is removed to form a second electrode contact region, and an electrode slurry is injected into the second electrode contact region to form the second electrode 180.

Figure 3:
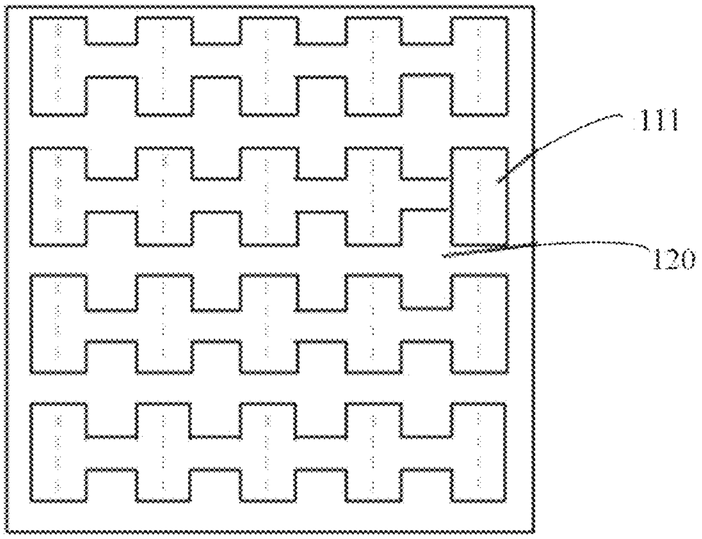
FIG. 3 is a bottom view of the patterned region after forming a hole.

The patterned region 111 on the first surface is patterned by a laser to form a hole with a width of 30 μm to 50 μm, and the passivation film layer and the anti-reflection film layer at the hole is removed to form a the first electrode 170 contact region. Hole regions are distributed in a dotted line or dots, as shown in FIG. 3, which is a bottom view of the patterned region 111 after forming the hole.

It should be understood that the first electrode 170 and the second electrode 180 may be formed by, but not limited to, screen printing. The first electrode 170 in contact with the doping layer 122 does not need to be opened. The first electrode is preferably made of burn-through electrode slurry, which can burn through the first passivation film layer 130 and the first anti-reflection film layer 150 at a high temperature to form a contact with the doping layer 122, while the substrate 110 is only in partial contact, and non-burn-through electrode slurry is used, so that the non-burn-through electrode slurry is in contact with that substrate 110 at the at the hole by a laser.

Specifically, the first electrode 170 and the second electrode 180 are metal electrodes. The material of the first electrode 170 and the material of the second electrode 180 are each independently selected from, but not limited to, one of aluminum and silver.

Figure 4:
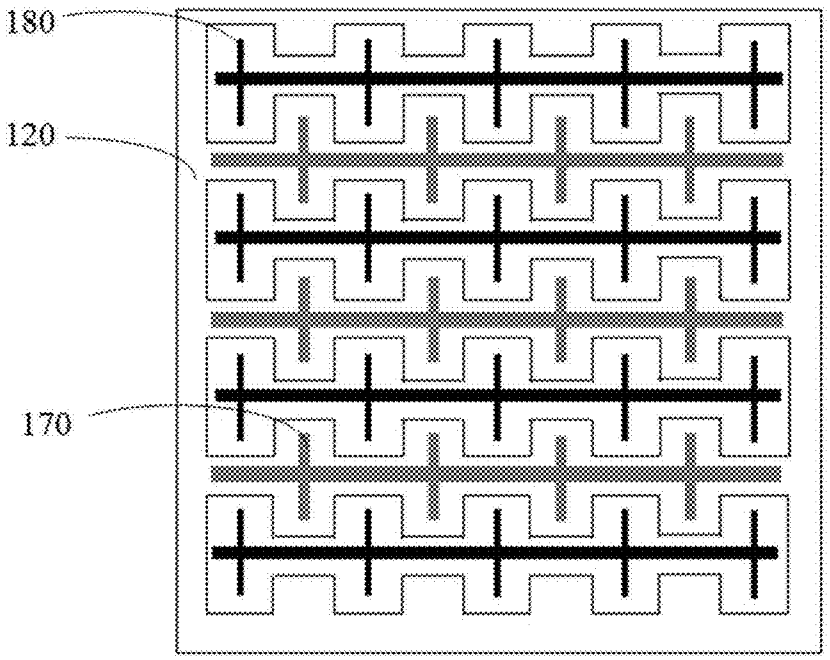
FIG. 4 is a bottom view of the solar cell according to the present disclosure.

Further, the solar cell 10 provided by the present disclosure is prepared according to the above-described production method for the solar cell 10. FIG. 4 is a bottom view of the solar cell 10.

The solar cell 10 prepared by the above preparation process is preferably a back contact cell.

The present disclosure further provides a photovoltaic system, including a solar cell assembly and an auxiliary device. The solar cell assembly includes the above-mentioned solar cell 10.

The preparation method of the solar cell of the present disclosure will be further described in detail in the following specific embodiments. Unless otherwise specified, the raw materials referred to in the following embodiments may be commercially available.

Example 1

The present example provides a p-type back contact solar cell, which is prepared by the following steps:

S10, A p-type silicon wafer substrate is subjected to de-damage treatment, polishing treatment, and cleaning treatment: a p-type monocrystalline silicon is used as a cell substrate, de-damage treatment is performed by using 60° C. solution containing potassium hydroxide, polishing treatment is performed by using solution containing potassium hydroxide at a temperature of 75° C., with a reflectivity of 30% after polishing, cleaning is performed by using a mixed solution of hydrofluoric acid and hydrochloric acid, and cleaning is performed by using deionized water and drying is performed.

S20, A silicon-containing film is formed on the p-type silicon wafer substrate: a silicon oxide layer with a thickness of 2 nm is formed on the p-type silicon wafer substrate in an atmosphere of silane gas at a flow rate of 2600 sccm and hydrogen gas at a flow rate of 9000 sccm, a power supply power of 9 KW, a plasma pulse on-off ratio of 1 to 100 ms, and a temperature of 400° C. An n-type doping layer with a thickness of 30 nm was first prepared on the above silicon oxide layer at a temperature of 400° C. in an atmosphere of 500 sccm of phosphine and 2800 sccm of silane, and then an n-type doping layer with a thickness of 130 nm was prepared in an atmosphere of 2500 sccm of phosphine and 2800 sccm of silane. A doping concentration of the n-type doping layer is 1E20 $cm^{-3}$ to 1E21 $cm^{-3}$. Silicon oxide with a thickness of 30 nm is grown in situ on a surface of the n-type doping layer as the mask layer by introducing oxygen at a high temperature using the thermal oxygen growth method. The above silicon-containing film was annealed at a temperature of 920° C. for 45 min.

S30, Performing patterning treatment: the silicon-containing film on the first surface is patterned by a laser to form a patterned region on the first surface of the silicon wafer substrate.

S40, Hydrofluoric acid solution by mixing hydrofluoric acid with a mass fraction of 49% and water in a ratio of 20:80 is prepared to remove a wrap plating of the silicon oxide mask layer generated on the front surface of the substrate.

Then, the solution containing potassium hydroxide or sodium hydroxide is used at a temperature of 80° C. to texture the front surface and etch a laser patterned region on the back surface to remove the residual polysilicon material in the n-type doped region, and the water washing, alkali washing, and water washing are successively performed. Due to the protection of the silicon oxide mask layer, a hydrofluoric acid solution is finally used to remove the remaining silicon oxide mask layer, followed by water washing and drying.

S50, The front surface and the back surface of the cell are plated respectively. A 3 nm aluminum oxide film is simultaneously plated on the front surface and the back surface using an atomic layer deposition equipment in a single insertion mode to serve as a first passivation film layer and a second passivation film layer, and then a 100 nm composite film layer of silicon oxide, silicon oxynitride and silicon nitride is plated on the front surface by plasma enhanced chemical vapor deposition (PECVD) to serve as a second anti-reflection film layer, and finally a 100 nm composite film layer of silicon oxide, silicon oxynitride and silicon nitride is plated on the back surface by PECVD to serve as the first anti-reflection film layer.

S60, The p-type substrate region exposed after patterning the patterned region on the back surface is opened using a laser. The hole region is distributed in a dotted line or dots. A width of the hole is 40 μm. The hole region serves as an electrode contact region of the p-type substrate region. An electrode slurry layer containing a conductive component is formed on an electrode contact region of a p-type substrate region and an electrode contact region of an n-type doping layer on that back surface of the cell by screen printing. The aluminum grid line electrode is used as a positive electrode of the cell, and the silver grid line electrode is used as a cathode negative electrode of the cell.

Comparative Example 1

The present comparative example provides a p-type back contact solar cell, which is prepared by the following steps:

S10, A p-type silicon wafer substrate is subjected to de-damage treatment, polishing treatment, and cleaning treatment: a p-type monocrystalline silicon is used as a cell substrate, de-damage treatment is performed by using 60° C. solution containing potassium hydroxide, polishing treatment is performed by using solution containing potassium hydroxide at a temperature of 75° C., with a reflectivity of 30% after polishing, cleaning is performed by using a mixed solution of hydrofluoric acid and hydrochloric acid, and cleaning is performed by using deionized water and drying is performed.

S20, A silicon-containing film is formed on the p-type silicon wafer substrate: a silicon oxide layer with a thickness of 2 nm is formed on the p-type silicon wafer substrate in an atmosphere of silane gas at a flow rate of 2600 sccm and hydrogen gas at a flow rate of 9000 sccm, a power supply power of 9 KW, a plasma pulse on-off ratio of 1 to 100 ms, and a temperature of 400° C. An n-type doping layer with a thickness of 160 nm was prepared on the above silicon oxide layer at a temperature of 400° C. in an atmosphere of 2500 sccm of phosphine and 2800 sccm of silane. Silicon oxide with a thickness of 30 nm is grown in situ on A surface of the n-type doping layer as the mask layer by introducing oxygen at a high temperature using the thermal oxygen growth method. The above silicon-containing film was annealed at a temperature of 920° C. for 45 min.

S30, Performing patterning treatment: the silicon-containing film on the first surface is patterned by a laser to form a patterned region on the first surface of the silicon wafer substrate.

S40, Hydrofluoric acid solution by mixing hydrofluoric acid with a mass fraction of 49% and water in a ratio of 20:80 is prepared to remove a wrap plating of the silicon oxide mask layer generated on the front surface of the substrate.

Then, the solution containing potassium hydroxide or sodium hydroxide is used at a temperature of 80° C. to texture the front surface and etch a laser patterned region on the back surface to remove the residual polysilicon material in the n-type doped region, and the water washing, alkali washing, and water washing are successively performed. Due to the protection of the silicon oxide mask layer, a hydrofluoric acid solution is finally used to remove the remaining silicon oxide mask layer, followed by water washing and drying.

S50, The front surface and the back surface of the cell are plated respectively. A 3 nm aluminum oxide film is simultaneously plated on the front surface and the back surface using an atomic layer deposition equipment in a single insertion mode to serve as a first passivation film layer and a second passivation film layer, and then a 100 nm composite film layer of silicon oxide, silicon oxynitride and silicon nitride is plated on the front surface by plasma enhanced chemical vapor deposition (PECVD) to serve as a second anti-reflection film layer, and finally a 100 nm composite film layer of silicon oxide, silicon oxynitride and silicon nitride is plated on the back surface by PECVD to serve as the first anti-reflection film layer.

S60, The p-type substrate region exposed after patterning the patterned region on the back surface is opened using a laser. The hole region is distributed in a dotted line or dots. A width of the hole is 40 μm. The hole region serves as an electrode contact region of the p-type substrate region. An electrode slurry layer containing a conductive component is formed on an electrode contact region of a p-type substrate region and an electrode contact region of an n-type doping layer on that back surface of the cell by screen printing. The aluminum grid line electrode is used as a positive electrode of the cell, and the silver grid line electrode is used as a cathode negative electrode of the cell.

Comparative Example 2

The present comparative example provides a p-type back contact solar cell, which is prepared by the following steps:

S10, A p-type silicon wafer substrate is subjected to de-damage treatment, polishing treatment, and cleaning treatment: a p-type monocrystalline silicon is used as a cell substrate, de-damage treatment is performed by using 60° C. solution containing potassium hydroxide, polishing treatment is performed by using solution containing potassium hydroxide at a temperature of 75° C., with a reflectivity of 30% after polishing, cleaning is performed by using a mixed solution of hydrofluoric acid and hydrochloric acid, and cleaning is performed by using deionized water and drying is performed.

S20, A silicon-containing film is formed on the p-type silicon wafer substrate: a silicon oxide layer with a thickness of 2 nm is formed on the p-type silicon wafer substrate in an atmosphere of silane gas at a flow rate of 2600 sccm and hydrogen gas at a flow rate of 9000 sccm, a power supply power of 9 KW, a plasma pulse on-off ratio of 1 to 100 ms, and a temperature of 400° C. An n-type doping layer with a thickness of 30 nm was first prepared on the above silicon oxide layer at a temperature of 400° C. in an atmosphere of 2000 sccm of phosphine and 2800 sccm of silane, and then an n-type doping layer with a thickness of 130 nm was prepared in an atmosphere of phosphine with a flow rate of 2500 sccm and silane with a flow rate of 2800 sccm. A doping concentration of the n-type doping layer is 1E20 cm-3 to 1E21 cm-3. Silicon oxide with a thickness of 30 nm is grown in situ on a surface of the n-type doping layer as the mask layer by introducing oxygen at a high temperature using the thermal oxygen growth method. The above silicon-containing film was annealed at a temperature of 920° C. for 45 min.

S30, Performing patterning treatment: the silicon-containing film on the first surface is patterned by a laser to form a patterned region on the first surface of the silicon wafer substrate.

S40, Hydrofluoric acid solution by mixing hydrofluoric acid with a mass fraction of 49% and water in a ratio of 20:80 is prepared to remove a wrap plating of the silicon oxide mask layer generated on the front surface of the substrate.

Then, the solution containing potassium hydroxide or sodium hydroxide is used at a temperature of 80° C. to texture the front surface and etch a laser patterned region on the back surface to remove the residual polysilicon material in the n-type doped region, and the water washing, alkali washing, and water washing are successively performed. Due to the protection of the silicon oxide mask layer, a hydrofluoric acid solution is finally used to remove the remaining silicon oxide mask layer, followed by water washing and drying.

S50, The front surface and the back surface of the cell are plated respectively. A 3 nm aluminum oxide film is simultaneously plated on the front surface and the back surface using an atomic layer deposition equipment in a single insertion mode to serve as a first passivation film layer and a second passivation film layer, and then a 100 nm composite film layer of silicon oxide, silicon oxynitride and silicon nitride is plated on the front surface by plasma enhanced chemical vapor deposition (PECVD) to serve as a second anti-reflection film layer, and finally a 100 nm composite film layer of silicon oxide, silicon oxynitride and silicon nitride is plated on the back surface by PECVD to serve as the first anti-reflection film layer.

S60, The p-type substrate region exposed after patterning the patterned region on the back surface is opened using a laser. The hole region is distributed in a dotted line or dots. A width of the hole is 40 μm. The hole region serves as an electrode contact region of the p-type substrate region. An electrode slurry layer containing a conductive component is formed on an electrode contact region of a p-type substrate region and an electrode contact region of an n-type doping layer on that back surface of the cell by screen printing. The aluminum grid line electrode is used as a positive electrode of the cell, and the silver grid line electrode is used as a cathode negative electrode of the cell.

The performance of the p-type back contact solar cell provided in embodiment 1 of the present disclosure is as follows: the conversion efficiency is 24.8%, the open circuit voltage is 720 mv, the current is 18 A, and the filling factor FF is more than 83%. In the comparative example 1, the p-type back-contact solar cell is finally prepared using only one flow condition to prepare the doping layer, and the cell conversion efficiency is lower than 24.2%. In comparative example 2, the p-type back contact solar cell prepared by introducing a high flow rate of doping source gas when preparing the doping layer has an open circuit voltage lower than 715 mV, a short-circuit current lower than 18 A, a filling factor FF lower than 83%, and a conversion efficiency lower than 24%. The conversion efficiency of conventional emitter and back-passivated PERC cells is usually between 21% and 22%.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. It should be understood that technical solutions obtained by those skilled in the art through logical analysis, reasoning or limited experiments on the basis of the technical solutions provided by the present disclosure are within the protection scope of the appended claims of the present disclosure. Therefore, the protection scope of the present disclosure patent shall be subject to the contents of the appended claims, and the description and drawings may be used to interpret the contents of the claims.

What is claimed is:

1. A preparation method for a solar cell, comprising the following steps:

S10, providing a silicon wafer substrate, wherein the silicon wafer substrate has a first surface and a second surface opposite to the first surface;

S20, forming a silicon-containing film on the first surface of the silicon wafer substrate, the silicon-containing film comprising a silicon oxide layer, a doping layer having a thickness of 30 nm to 300 nm, and a mask layer that are sequentially formed on the first surface of the silicon wafer substrate, wherein a method for forming the doping layer comprises: forming a doping layer having an initial thickness of 10 nm to 30 nm in an atmosphere in which a flow rate of a doping gas source is 100 sccm to 1000 sccm and a flow rate of silane is 1000 sccm to 4000 sccm, and forming a remaining thickness of the doping layer in an atmosphere in which a flow rate of the doping gas source is 1500 sccm to 3000 sccm and a flow rate of the silane is 1000 sccm to 4000 sccm;

S30, patterning the silicon-containing film on the first surface to form a patterned region; and S40, performing texturing treatment to the silicon wafer substrate having the silicon-containing film and the patterned region.

2. The preparation method for the solar cell according to claim 1, wherein a temperature for forming the doping layer in step S20 is 200° C. to 700° C.

3. The preparation method for the solar cell according to claim 1, wherein the doping gas source is selected from at least one of phosphorane, diborane, trimethylborane, and boron trifluoride.

4. The preparation method for the solar cell according to claim 1, further comprising a step of annealing after step S20 and prior to step S30.

5. The preparation method for the solar cell according to claim 4, wherein in the step of annealing, an annealing temperature is 800° C. to 950° C., and an annealing time is 30 min to 50 min.

6. The preparation method for the solar cell according to claim 1, wherein the silicon oxide layer is formed on the first surface by plasma enhanced chemical vapor deposition, low pressure chemical vapor deposition, or thermal oxygen.

7. The preparation method for the solar cell according to claim 1, wherein a thickness of the silicon oxide layer 0.5 nm to 2.5 nm.

8. The preparation method for the solar cell according to claim 1, wherein the mask layer is formed on the doping layer by thermal oxygen, plasma enhanced chemical vapor deposition, or low pressure chemical vapor deposition.

9. The preparation method for the solar cell according to claim 1, wherein a thickness of the mask layer is 5 nm to 100 nm.

10. The preparation method for the solar cell according to claim 1, further comprising: S50, after preparing the silicon wafer substrate with a textured surface, forming a first passivation film layer and a first anti-reflection film layer sequentially on the first surface of the silicon wafer substrate with the textured surface.

11. The preparation method for the solar cell according to claim 1, further comprising: after preparing the silicon wafer substrate with a textured surface, forming a second passivation film layer and a second anti-reflection film layer sequentially on the second surface of the silicon wafer substrate with the textured surface.

12. The preparation method for the solar cell according to claim 10, further comprising, after step S50, a step S60, forming a hole on the patterned region on the first surface by patterning using a laser, and preparing a first electrode and a second electrode by screen printing.

13. A solar cell prepared by a preparation method comprising the following steps:

S10, providing a silicon wafer substrate, wherein the silicon wafer substrate has a first surface and a second surface opposite to the first surface;

S20, forming a silicon-containing film on the first surface of the silicon wafer substrate, the silicon-containing film comprising a silicon oxide layer, a doping layer having a thickness of 30 nm to 300 nm, and a mask layer that are sequentially formed on the first surface of the silicon wafer substrate, wherein a method for forming the doping layer comprises: forming a doping layer having an initial thickness of 10 nm to 30 nm in an atmosphere in which a flow rate of a doping gas source is 100 sccm to 1000 sccm and a flow rate of silane is 1000 sccm to 4000 sccm, and forming a remaining thickness of the doping layer in an atmosphere in which a flow rate of the doping gas source is 1500 sccm to 3000 sccm and a flow rate of the silane is 1000 sccm to 4000 sccm;

S30, patterning the silicon-containing film on the first surface to form a patterned region; and S40, performing texturing treatment to the silicon wafer substrate having the silicon-containing film and the patterned region.

14. The solar cell according to claim 13, wherein a temperature for forming the doping layer in step S20 is 200° C. to 700° C.

15. The solar cell according to claim 13, wherein the doping gas source is selected from at least one of phosphorane, diborane, trimethylborane, and boron trifluoride.

16. The solar cell according to claim 13, wherein the preparation method further comprises a step of annealing after step S20 and prior to step S30.

17. The solar cell according to claim 16, wherein in the step of annealing, an annealing temperature is 800° C. to 950° C., and an annealing time is 30 min to 50 min.

18. The solar cell according to claim 13, wherein a thickness of the silicon oxide layer 0.5 nm to 2.5 nm.

19. The solar cell according to claim 13, wherein a thickness of the mask layer is 5 nm to 100 nm.

20. A photovoltaic system, comprising a solar cell assembly and an auxiliary device, the solar cell assembly comprising the solar cell according to claim 13.

* * * * *